(12) United States Patent
Yang et al.

(10) Patent No.: US 12,677,510 B2
(45) Date of Patent: Jul. 7, 2026

(54) DISPLAY DEVICE

(71) Applicant: Samsung Display Co., Ltd., Yongin-Si (KR)

(72) Inventors: Ji Seong Yang, Suwon-si (KR); Min-Hee Kim, Ansan-si (KR); Tae Hoon Kim, Suwon-si (KR); Joon-Hyung Park, Seoul (KR); Simbum Yuk, Hwaseong-si (KR); Kang Seob Jeong, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 721 days.

(21) Appl. No.: 17/975,812

(22) Filed: Oct. 28, 2022

(65) Prior Publication Data

US 2023/0163259 A1 May 25, 2023

(30) Foreign Application Priority Data

Nov. 25, 2021 (KR) ........................ 10-2021-0164663

(51) Int. Cl.
| | |
|---|---|
| *H10H 20/851* | (2025.01) |
| *H10H 20/841* | (2025.01) |
| *H10H 20/853* | (2025.01) |
| *H10H 20/857* | (2025.01) |
| *H10W 90/00* | (2026.01) |

(52) U.S. Cl.
CPC ...... *H10H 20/8514* (2025.01); *H10H 20/841* (2025.01); *H10H 20/853* (2025.01); *H10H 20/857* (2025.01); *H10W 90/00* (2026.01)

(58) Field of Classification Search
CPC ............ H10H 20/8514; H10H 20/841; H10H 20/853; H10H 20/857; H01L 25/0753; H10K 59/122; H10K 59/873; H10K 59/879; H10K 59/878; H10K 59/38; H10K 50/844; H10K 50/856
See application file for complete search history.

(56) References Cited

U.S. PATENT DOCUMENTS

| | | | |
|---|---|---|---|
| 2005/0064306 | A1 | 3/2005 | Katagami et al. |
| 2009/0168144 | A1 | 7/2009 | Lo et al. |
| 2020/0152706 | A1 | 5/2020 | Kim et al. |
| 2020/0266253 | A1 | 8/2020 | Kim et al. |
| 2021/0359011 | A1 | 11/2021 | Lee |
| 2022/0229214 | A1 | 7/2022 | Kim et al. |
| 2022/0231200 | A1 | 7/2022 | Kim et al. |

(Continued)

FOREIGN PATENT DOCUMENTS

| | | |
|---|---|---|
| JP | 2006-072176 A | 3/2006 |
| KR | 10-2005-0026895 A | 3/2005 |
| KR | 10-2018-0078908 A | 7/2018 |

(Continued)

*Primary Examiner* — Thanh Y. Tran
(74) *Attorney, Agent, or Firm* — Innovation Counsel LLP

(57) ABSTRACT

Provided is a display device including a substrate, light emitting diodes disposed on the substrate, a first encapsulation layer disposed on the light emitting diodes, a bank disposed on the first encapsulation layer to define openings and a well; a color conversion layer and a transmission layer individually disposed within the openings, and a reflective layer disposed within the well and disposed between the color conversion layer and the transmission layer.

20 Claims, 11 Drawing Sheets

(56)                    References Cited

U.S. PATENT DOCUMENTS

2022/0302231  A1       9/2022  Son et al.
2023/0005995  A1*     1/2023  Lim ...................... B41M 3/003

FOREIGN PATENT DOCUMENTS

KR       10-2020-0056522  A       5/2020
KR       10-2020-0100910  A       8/2020
KR       10-2020-0111325  A       9/2020
KR       10-2021-0000184  A       1/2021
KR       10-2021-0110451  A       9/2021
KR       10-2021-0142038  A      11/2021
KR       10-2022-0105244  A       7/2022
KR       10-2022-0105708  A       7/2022
KR       10-2022-0130295  A       9/2022

* cited by examiner

DISPLAY DEVICE

CROSS-REFERENCE TO RELATED APPLICATION

This application claims priority to and benefits of Korean Patent Application No. 10-2021-0164663, filed in the Korean Intellectual Property Office on Nov. 25, 2021, the entire contents of which are incorporated herein by reference.

BACKGROUND

(a) Technical Field

The present disclosure relates to a display device, and more particularly, to a display device including a color conversion unit for improving light efficiency.

(b) Description of the Related Art

As a display device, an emissive display device displaying an image by controlling luminance of light-emitting devices and a liquid crystal display displaying an image by controlling transmittance of a liquid crystal layer are widely used. Unlike a liquid crystal display, the emissive display device may not require a separate light source so as to reduce thickness and weight thereof. Further, the emissive display device has high quality characteristics such as low power consumption, high luminance, high response speed, and the like.

Recently, a display device including a color conversion unit has been proposed to reduce light loss and implement a display device with high color reproducibility. The color conversion unit may include color conversion layers in which quantum dots are dispersed, and may convert incident light into different colors.

The above information disclosed in this Background section is only for enhancement of understanding of the background, and therefore, it may contain information that does not form the prior art that is already known in this country to a person of ordinary skill in the art.

SUMMARY

Embodiments provide a display device including a color conversion unit capable of improving light efficiency and the like.

A display device according to an embodiment includes: a substrate; light emitting diodes disposed on the substrate; a first encapsulation layer disposed on the light emitting diodes; a bank disposed on the first encapsulation layer to define openings and a well; a color conversion layer and a transmission layer individually disposed within the openings; and a reflective layer disposed within the well and disposed between the color conversion layer and the transmission layer.

The color conversion layer and the transmission layer may each overlap one of the light emitting diodes, and the reflective layer may not overlap any of the light emitting diodes.

A height of the reflective layer may be lower than a height of the color conversion layer or the transmission layer.

The display device may further include a second encapsulation layer disposed on the bank, the color conversion layer, the transmission layer, and the reflective layer. The second encapsulation layer may include a low refractive index layer.

The display device may further include: a first color filter disposed on the second encapsulation layer to overlap the color conversion layer and the reflective layer; and a second color filter disposed on the second encapsulation layer to overlap the transmission layer and the reflective layer.

A lower surface of the bank may be in contact with an upper surface of the first encapsulation layer.

A lower surface of the color conversion layer and a lower surface of the transmission layer may be in contact with an upper surface of the first encapsulation layer.

A lower surface of the reflective layer may be in contact with an upper surface of the first encapsulation layer.

The well may be formed in a form of a groove in the bank.

An area of the well may be larger than an area of each of the openings.

The well may be partitioned into a plurality of portions by the bank, and the plurality of portions may include a first portion disposed at a central portion and second portions surrounding the first portion.

The bank may have surface energy of 25 dyne/cm or less.

The bank may be transparent.

The reflective layer may be formed by curing white ink.

The color conversion layer may include quantum dots and scatterers, and the transmission layer and the reflective layer may include scatterers.

A display device according to an embodiment includes: a substrate; first, second, and third transistors disposed on the substrate; an insulating layer disposed on the first, second, and third transistors; first, second, and third light emitting diodes disposed on the insulating layer to be electrically connected to the first, second, and third transistors, respectively; an encapsulation layer disposed on the first, second, and third light emitting diodes to include an inorganic layer and an organic layer; a bank disposed on the encapsulation layer to define the first, second, and third openings and a well; a first color conversion layer, a second color conversion layer, and a transmission layer disposed in the first, second, and third openings respectively and overlapping the first, second, and third light emitting diodes, respectively; and a reflective layer disposed within the well and disposed between the first color conversion layer or the second color conversion layer and the transmission layer.

A height of the reflective layer may be lower than a height of the first color conversion layer, the second color conversion layer, or the transmission layer.

The bank may have surface energy of 25 dyne/cm or less.

The first and second color conversion layers may include quantum dots and scatterers, and the transmission layer and the reflective layer may include scatterers.

Each of the bank, the first color conversion layer, the second color conversion layer, and the transmission layer may be in contact with the encapsulation layer.

According to the embodiments, it is possible to improve optical efficiency of the display device. In addition, according to the embodiments, it is possible to prevent or reduce the position of the droplet on the bank, and even when the droplet is positioned, it is possible to reduce a size thereof. In addition, according to the embodiments, a thickness and a weight of the display device may be reduced, and resolution thereof may be increased. Further, according to the embodiments, there are other advantageous effects that can be recognized throughout the specification.

DETAILED DESCRIPTION

Figure 1:
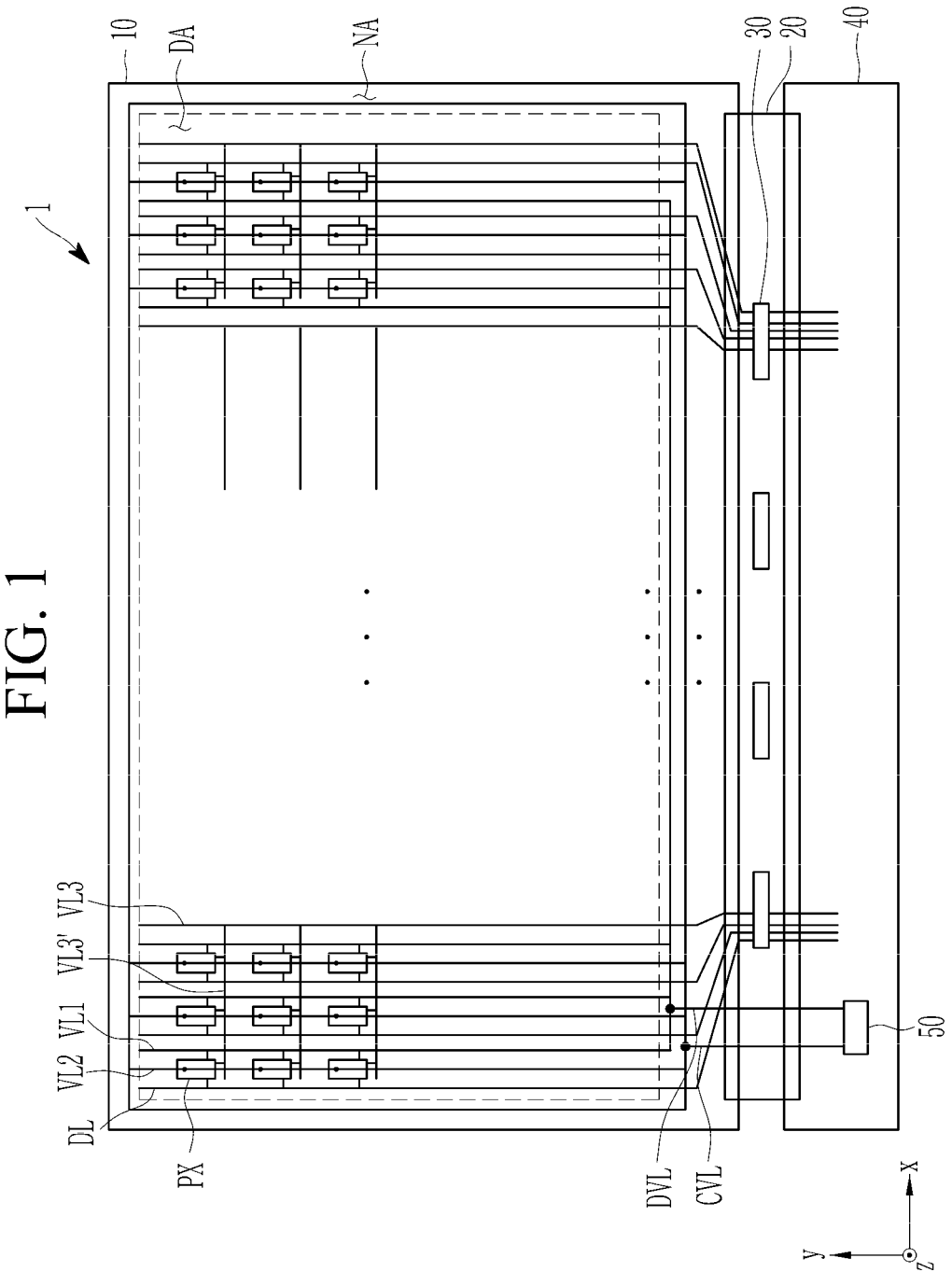
FIG. 1 illustrates a top plan view of a display device according to an embodiment.

The present disclosure will be described more fully hereinafter with reference to the accompanying drawings, in which embodiments are shown.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In the specification, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

FIG. 1 illustrates a schematic top plan view of a display device according to an embodiment.

Referring to FIG. 1, a display device 1 may include a display panel 10, a flexible printed circuit film 20, a driving integrated circuit chip 30, a printed circuit board 40, and a power module 50.

The display panel 10 may include a display area DA corresponding to a screen on which an image is displayed and a non-display area NA, and circuits and/or wires for generating and/or transferring various signals and voltages applied to the display area DA are disposed in the non-display area NA. The non-display area NA may be adjacent to the display area DA, and may surround the display area DA. In FIG. 1, an inner area and an outer area of a dotted rectangle may be the display area DA and the non-display area NA, respectively.

Pixels PX are disposed in a matrix form in the display area DA of the display panel 10. In addition, in the display area DA, a data line DL for transferring a data voltage $V_{DATA}$, a driving voltage line VL1 for transferring a driving voltage $EL_{VDD}$, a common voltage line VL2 for transferring a common voltage $EL_{VSS}$, and an initialization voltage line VL3 for transferring an initialization voltage $V_{INT}$ may be positioned. The driving voltage line VL1, the common voltage line VL2, and the initialization voltage line VL3 may extend in a second direction y. The initialization voltage line VL3 may include a branch voltage line VL3' extending in a first direction x. Each pixel PX may receive the data voltage $V_{DATA}$, the driving voltage $EL_{VDD}$, the common voltage $EL_{VSS}$, and the initialization voltage $V_{INT}$ from such lines. The driving voltage $EL_{VDD}$ and the common voltage $EL_{VSS}$ are power voltages applied to each pixel PX, and the driving voltage line VL1 and the common voltage line VL2 that each transfer such power supply voltages may be referred to as power voltage lines. The driving voltage $EL_{VDD}$ may be higher than the common voltage $EL_{VSS}$. The driving voltage $EL_{VDD}$ may be referred to as a first power voltage or a high potential power voltage. The common voltage $EL_{VSS}$ may be referred to as a second power voltage or a low potential power voltage.

In the non-display area NA of the display panel 10, a gate driver (not illustrated) may be positioned at opposite sides of the display area DA. A gate driver may be integrated in the non-display area NA. The pixels PX may receive a gate signal (also referred to as a scan signal) generated by the gate driver to receive the data voltage $V_{DATA}$ at predetermined timing.

A driving voltage transfer line DVL connected to driving voltage lines VL1 and a common voltage transfer line CVL connected to common voltage lines VL2 may be positioned in the non-display area NA of the display panel 10. Each of the driving voltage transfer line DVL and the common voltage transfer line CVL may include one portion extending in a second direction y and the other portion extending in a first direction x which is perpendicular to the second direction y. The common voltage transfer line CVL may be positioned to surround the display area DA. The common voltage lines VL2 may be connected to the common voltage transfer line CVL at lower and upper sides of the display area DA, thereby uniformly supplying a common voltage $EL_{VSS}$ over the entire display area DA.

A first end of the flexible printed circuit film 20 may be connected or bonded to the display panel 10, and a second end may be connected or bonded to the printed circuit board 40. A driving integrated circuit chip 30 including a data driver for applying the data voltage $V_{DATA}$ to a data line DL may be positioned on the flexible printed circuit film 20.

A power module 50 generating a power voltage such as the driving voltage $EL_{VDD}$ and the common voltage $EL_{VSS}$ may be positioned on the printed circuit board 40. The power module 50 may be provided in the form of an integrated circuit chip. A signal controller (not illustrated) for controlling the data driver and the gate driver may be disposed in the printed circuit board 40.

Figure 2:
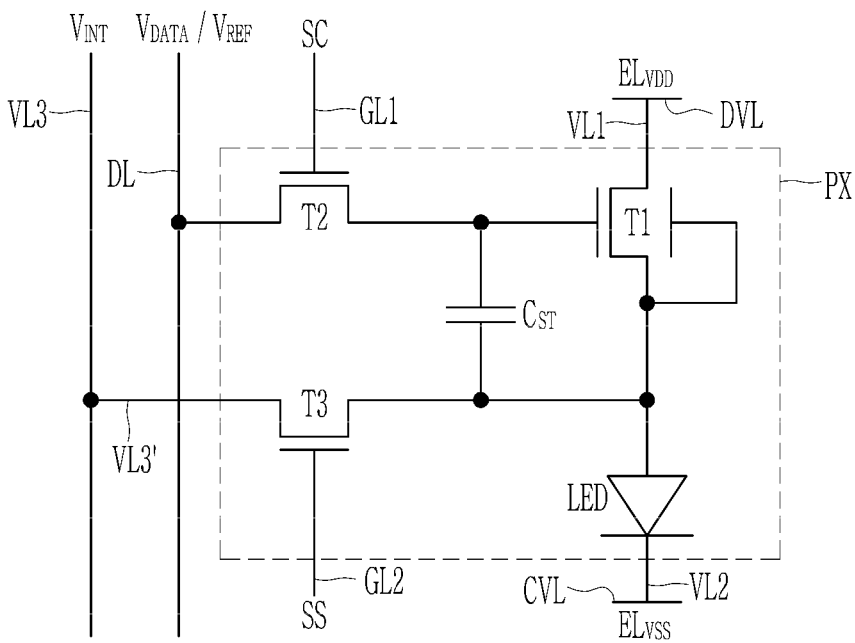
FIG. 2 illustrates a circuit diagram of a pixel of a display device according to an embodiment.

FIG. 2 illustrates a circuit diagram of a pixel of a display device according to an embodiment.

Referring to FIG. 2, one pixel PX may include first to third transistors T1, T2, and T3, a storage capacitor $C_{ST}$, and a light emitting diode LED. The light emitting diode LED may be an organic or inorganic light emitting diode. The first to third transistors T1, T2, and T3 may be N-type transistors, and at least some of them may be P-type transistors.

A gate electrode of the first transistor T1 may be connected to a first electrode of the storage capacitor $C_{ST}$. A first electrode of the first transistor T1 may be connected to the driving voltage line VL1 that transfers the driving voltage $EL_{VDD}$, and a second electrode of the first transistor T1 may be connected to an anode of the light emitting diode LED and a second electrode of the storage capacitor $C_{ST}$. The first transistor T1 may receive a data voltage $V_{DATA}$ depending on a switching operation of the second transistor T2 to supply a driving current to the light emitting diode LED depending on a voltage stored in the storage capacitor $C_{ST}$.

A gate electrode of the second transistor T2 may be connected to a first gate line GL1 through which a first scan signal SC is transferred. A first electrode of the second transistor T2 may be connected to the data line DL capable of transferring the data voltage $V_{DATA}$ or a reference voltage $V_{REF}$. A second electrode of the second transistor T2 may be connected to the first electrode of the storage capacitor $C_{ST}$ and the gate electrode of the first transistor T1. The second transistor T2 is turned on based on the first scan signal SC to transfer the reference voltage $V_{REF}$ or the data voltage $V_{DATA}$ to the gate electrode of the first transistor T1.

A gate electrode of the third transistor T3 may be connected to a second gate line GL2 through which a second scan signal SS is transferred. A first electrode of the second transistor T3 may be connected to the second electrode of the storage capacitor $C_{ST}$, the second electrode of the first transistor T1, and the anode. A second electrode of the third transistor T3 may be connected to an initialization voltage line VL3 for transferring an initialization voltage $V_{INT}$. The third transistor T3 may be turned on in response to the second scan signal SS to initialize an anode voltage by transferring the initialization voltage $V_{INT}$ to the anode.

The first electrode of the storage capacitor $C_{ST}$ may be connected to the gate electrode of the first transistor T1, and the second electrode of the storage capacitor $C_{ST}$ may be connected to the anode and the first electrode of the third transistor T3. The cathode of the light emitting diode LED may be connected to the common voltage line VL2 for transferring the common voltage $EL_{VSS}$. Each light emitting diode LED may constitute one pixel PX, and an anode and a cathode of the light emitting diode LED may be referred to as a pixel electrode and a common electrode, respectively.

The light emitting diode LED may emit light having luminance (grayscale) based on a driving current generated by the first transistor T1.

An example of an operation of a circuit illustrated in FIG. 2, particularly for operation during one frame, will be described taking as an example the case where the transistors T1, T2, and T3 are all N-type transistors.

When one frame is started, the first scan signal SC of a high level and the second scan signal SS of a high level may be supplied during an initialization period and the second transistor T2 and the third transistor T3 may be turned on. A reference voltage $V_{REF}$ from the data line DL may be supplied to the gate electrode of the first transistor T1 and the first electrode of the storage capacitor $C_{ST}$ through the turned-on second transistor T2, and the initialization voltage $V_{INT}$ may be supplied to the second electrode of the first transistor T1 and the anode through the turned-on third transistor T3. Accordingly, the anode may be initialized by using the initialization voltage $V_{INT}$ during the initialization period. A voltage difference between the reference voltage $V_{REF}$ and the initialization voltage $V_{INT}$ may be stored in the storage capacitor $C_{ST}$.

Next, when the second scan signal SS is changed to a low level in a state where the first scan signal SC of a high level is maintained for a sensing period, the second transistor T2 may maintain a turn-on state and the third transistor T3 may be turned off. The gate electrode of the first transistor T1 and the first electrode of the storage capacitor $C_{ST}$ may maintain a reference voltage $V_{REF}$ through the turned-on second transistor T2, and the anode and the second electrode of the first transistor T1 may be disconnected from the initialization voltage $V_{INT}$ through the turned-off third transistor T3. Accordingly, when a current flows from the first electrode to the second electrode of the first transistor T1 and a voltage of the second electrode becomes a "reference voltage-threshold voltage", the first transistor T1 may be turned off. Herein, the threshold voltage is a threshold voltage of the first transistor T1. In this case, a voltage difference between the gate electrode and the second electrode of the first transistor T1 may be stored in the storage capacitor $C_{ST}$, and the threshold voltage of the first transistor T1 may be completely sensed. A characteristic deviation of the first transistor T1 which may be different for each pixel PX may be compensated by generating a data voltage $V_{DATA}$ that is compensated by reflecting characteristic information sensed during the sensing period.

Next, when the first scan signal SC of the high level is supplied and the second scan signal SS of a low level is supplied during a data input period, the second transistor T2 may be turned on, but the third transistor T3 may be turned off. The data voltage $V_{DATA}$ from the data line DL may be supplied to the gate electrode of the first transistor T1 and the first electrode of the storage capacitor $C_{ST}$ through the turned-on second transistor T2. The data voltage $V_{DATA}$ may have a value that is compensated based on the sensing of the threshold voltage of the first transistor T1, thereby correcting a characteristic deviation of the first transistor T1

When the data voltage $V_{DATA}$ is applied, the anode and the second electrode of the first transistor T1 may substantially maintain a potential during the sensing period by the first transistor T1 in a turned-off state.

Next, the first transistor T1 that is turned on by the data voltage $V_{DATA}$ transferred to the gate electrode of the first transistor T1 during an emission period may generate a driving current according to the data voltage $V_{DATA}$, and the light emitting diode LED may emit light by the driving current. That is, luminance of the light emitting diode LED may be adjusted by controlling the driving current applied to the light emitting diode LED depending on a magnitude of the data voltage $V_{DATA}$ applied to the pixel PX.

Figure 3:
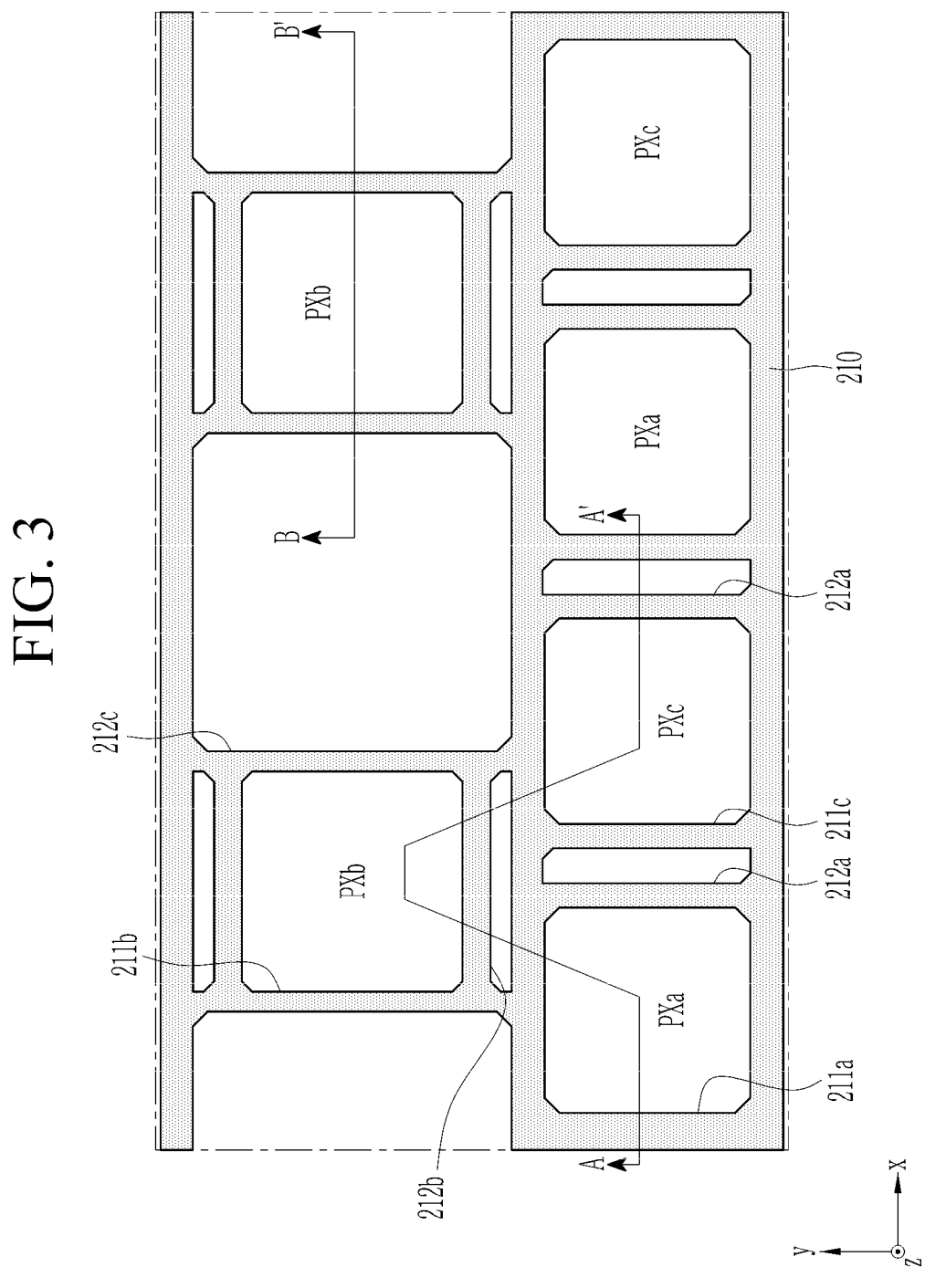
FIG. 3 illustrates a top plan view of a display area in a display panel according to an embodiment.
Figure 4:
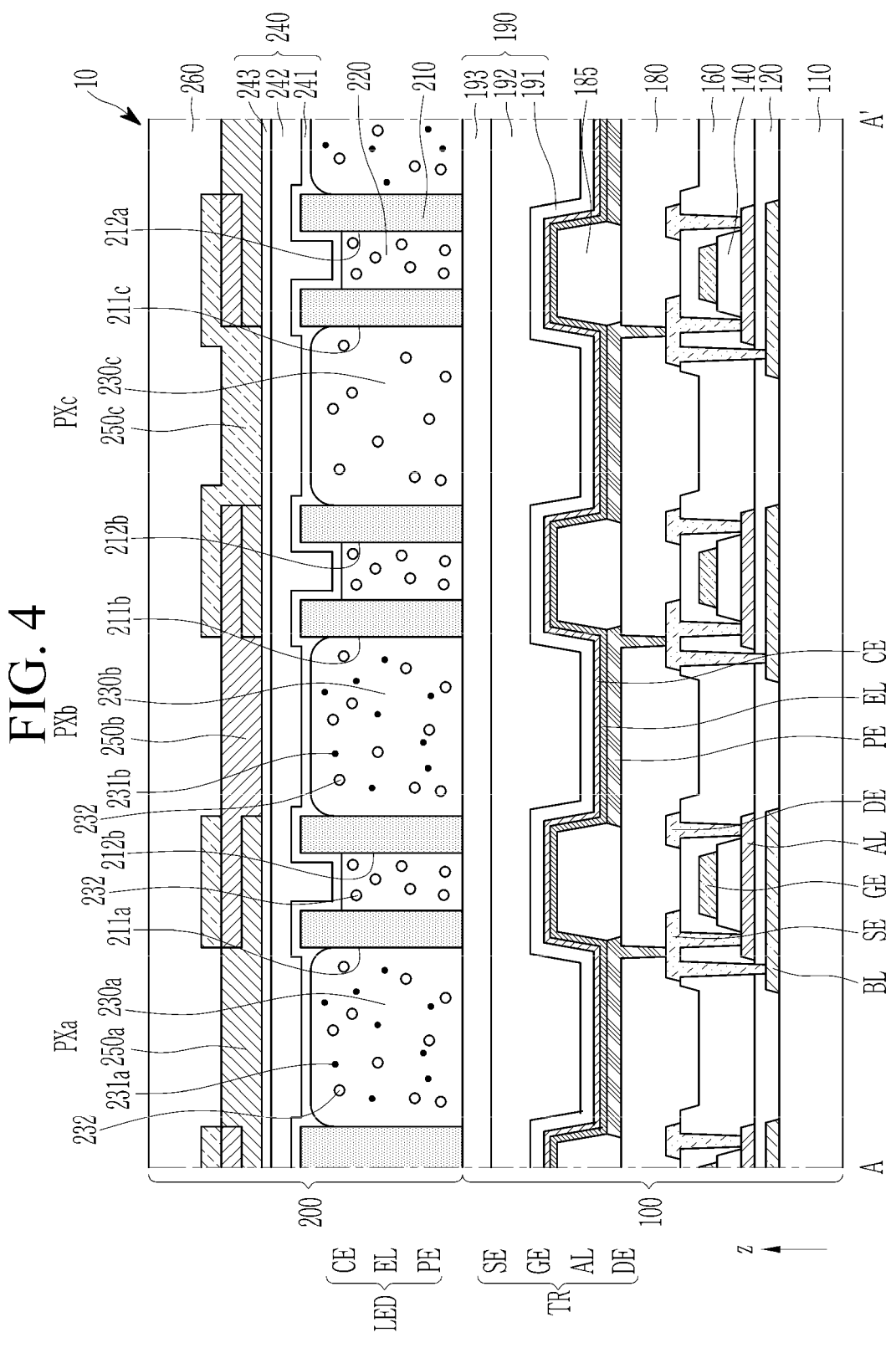
FIG. 4 illustrates a cross-sectional view taken along line A-A' of FIG. 3 according to an embodiment.
Figure 5:
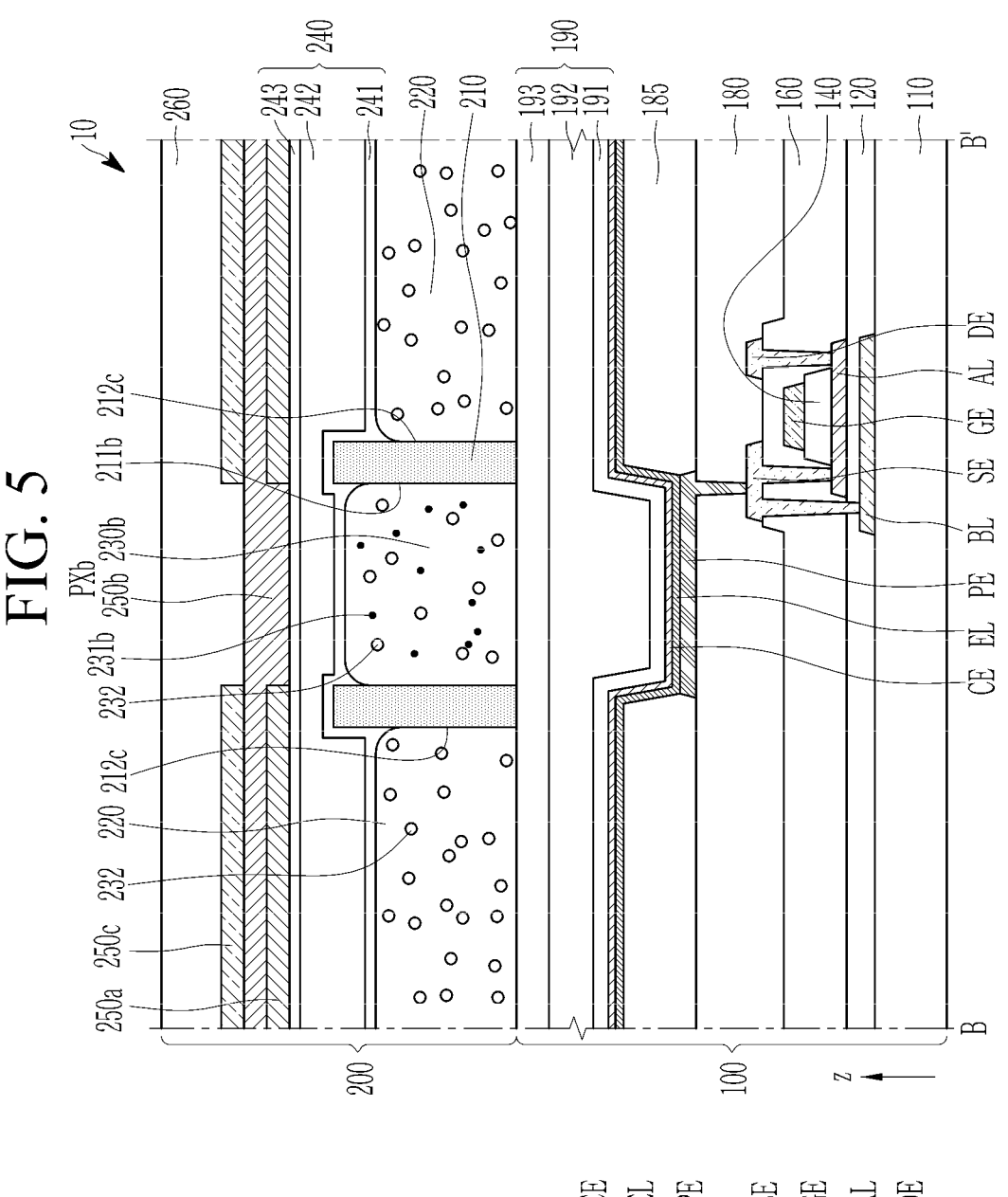
FIG. 5 illustrates a cross-sectional view taken along a line B-B' of FIG. 3 according to an embodiment.

FIG. 3 illustrates a top plan view of a display area in a display panel according to an embodiment, FIG. 4 illustrates a cross-sectional view taken along line A-A' of FIG. 3 according to an embodiment, and FIG. 5 illustrates a cross-sectional view taken along a line B-B' of FIG. 3 according to an embodiment.

Referring to FIG. 3, an area in which approximately six pixels PXa, PXb, and PXc are positioned in the display area DA is illustrated. The pixels PXa, PXb, and PXc may include a first pixel PXa, a second pixel PXb, and a third pixel PXc that display different colors. For example, the first pixel PXa may emit red light, the second pixel PXb may emit green light, and the third pixel PXc may emit blue light. In the display area DA, the first pixel PXa, the second pixel PXb, and the third pixel PXc may be repeatedly disposed in the first direction x and the second direction y.

Referring to FIG. 3, FIG. 4, and FIG. 5, the display panel 10 may include a display unit 100 and a color conversion unit 200. The color conversion unit 200 may be positioned on the display unit 100, and the color conversion unit 200 may entirely overlap the display unit 100.

The display unit 100 may include a light emitting diode LED corresponding to each of the pixels PXa, PXb, and PXc. The color conversion unit 200 may convert light emitted from the light diode emitting diode LED into a certain wavelength of light and emitit to the outside of the display panel 10.

The display unit 100 may include a substrate 110, a transistor TR positioned on the substrate 110, and a light emitting diode LED connected to the transistor TR.

The substrate 110 may include a material having a rigid characteristic, such as glass, or a material having a flexible characteristic, such as plastic. For example, the substrate 110 may be a glass substrate.

A light blocking layer BL may be disposed on the substrate 110. The light blocking layer BL may prevent external light from reaching the semiconductor layer AL of the transistor TR, thereby preventing characteristic deterioration of the semiconductor layer AL. The light blocking layer BL may control a leakage current of the transistor TR, particularly the driving transistor in which a current characteristic is important in an emissive display device. The light blocking layer BL may include a material that does not transmit light of a wavelength band to be blocked. For example, the light blocking layer BL may include a metal such as copper (Cu), aluminum (Al), molybdenum (Mo), titanium (Ti), or tungsten (W), and may be a single layer or multiple layers. For example, the light blocking layer BL may have a double layer structure including, e.g., titanium (Ti) and copper (Cu). The light blocking layer BL may function as an electrode that receives a specific voltage in the display panel 10. In this case, a current change rate in the saturation region of a voltage-current characteristic graph of the transistor TR may be reduced to improve characteristics as a driving transistor.

A buffer layer 120 may be positioned on the substrate 110 and the light blocking layer BL. The buffer layer 120 may improve a characteristic of a semiconductor layer AL by blocking impurities from the substrate 110 when the semiconductor layer AL is formed, and may flatten a surface of the substrate 110 to relieve a stress of the semiconductor layer AL. The buffer layer 120 may include an inorganic insulating material such as a silicon nitride ($SiN_x$), a silicon oxide ($SiO_x$), and a silicon oxynitride ($SiO_xN_y$). The buffer layer 120 may include amorphous silicon.

The semiconductor layer AL may be disposed on the buffer layer 120. The semiconductor layer AL may include a first region and a second region, and a channel region therebetween. The semiconductor layer AL may include an oxide semiconductor. For example, the semiconductor layer AL may include an oxide semiconductor such as an indium-gallium-zinc oxide (IGZO) including at least one of zinc (Zn), indium (In), gallium (Ga), tin (Sn), or a mixture thereof. The semiconductor layer AL may include polycrystalline silicon or amorphous silicon, e.g., low-temperature polysilicon (LTPS).

A gate insulating layer 140 may be disposed on the semiconductor layer AL. The gate insulating layer 140 may be formed in a region overlapping a gate electrode GE. Such a structure may be formed by etching the gate insulating layer 140 during a photolithography process for forming the gate electrode GE. Alternatively, the gate insulating layer 140 may be formed to substantially cover the entire substrate 110. The gate insulating layer 140 may include an inorganic insulating material such as a silicon oxide, a silicon nitride, and a silicon oxynitride, and may be a single layer or multiple layers.

The gate electrode GE may be positioned on the gate insulating layer 140. The gate electrode GE may overlap a channel region of the semiconductor layer AL. The gate electrode GE may include a metal such as molybdenum (Mo), aluminum (Al), copper (Cu), titanium (Ti), and the like, and may be a single layer or multiple layers. For example, the gate electrode GE may have a double layer structure including titanium (Ti), copper (Cu), and etc. The first gate line GL1 and/or the second gate line GL2 described above may have the same layer as that of the gate electrode GE. In the present specification, the same layer or being formed of the same layer may indicate that corresponding components are formed of the same material in a same process (e.g., a same photolithography process).

An interlayer insulating layer 160 may be disposed on the gate electrode GE and the buffer layer 120. The interlayer insulating layer 160 may include an inorganic insulating material such as a silicon oxide, a silicon nitride, and a silicon oxynitride, and may be a single layer or multiple layers.

The first electrode SE and the second electrode DE of the transistor TR may be positioned on the interlayer insulating layer 160. One of the first electrode SE and the second electrode DE may serve as a source electrode of the transistor TR, and the other may serve as a drain electrode of the transistor TR. The first electrode SE and the second electrode DE may be connected to the first region and the second region of the semiconductor layer AL through contact holes formed in the interlayer insulating layer 160, respectively. The first electrode SE or the second electrode DE may be connected to the light blocking layer BL through contact holes formed in the interlayer insulating layer 160, and the buffer layer 120. The first electrode SE and the second electrode DE may each include a metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the first electrode SE and the second electrode DE may each have a double-layer structure including, e.g., titanium (Ti)/copper (Cu), or a triple-layer structure including, e.g., titanium (Ti)/aluminum (Al)/titanium (Ti).

The data line DL, the driving voltage line VL1, the common voltage line VL2, the initialization voltage line VL3, the driving voltage transfer line DVL, and/or the common voltage transfer line CVL described above may have a same layer as that of the second electrode DE.

The semiconductor layer AL, the gate electrode GE, the first electrode SE, and the second electrode DE may constitute the transistor TR. The illustrated transistor TR may correspond to the first transistor T1 in the pixel PX of FIG. 2.

A planarization layer 180 may be disposed on the first electrode SE, the second electrode DE, and the interlayer insulating layer 160. The planarization layer 180 may include an organic insulating material such as a general purpose polymer such as poly(methylmethacrylate) and polystyrene, a polymer derivative having a phenolic group, an acrylic-based polymer, an imide-based polymer (e.g., polyimide), and a siloxane-based polymer.

A pixel electrode PE of the light emitting diode LED is positioned on the planarization layer 180. The pixel electrode PE may be connected to the first electrode SE through a contact hole formed in the planarization layer 180. The pixel electrode PE may be formed of a reflective conductive material or a translucent conductive material, or may be formed of a transparent conductive material. The pixel electrode PE may include a transparent conductive material such as an indium tin oxide (ITO) or an indium zinc oxide (IZO). The pixel electrode PE may include a metal such as lithium (Li), calcium (Ca), aluminum (Al), silver (Ag), magnesium (Mg), or gold (Au). The pixel electrode PE may have a multi-layered structure, e.g., may have a triple-layer structure including, e.g., ITO/silver (Ag)/ITO.

A pixel defining layer 185 may be disposed on the planarization layer 180, and an opening overlapping the pixel electrode PE may be formed in the pixel defining layer 185. The pixel defining layer 185 may include an organic insulating material such as an acryl-based polymer, an imide-based polymer, and an amide-based polymer. The pixel defining layer 185 may include a colored pigment such as a black pigment or a blue pigment. For example, the pixel defining layer 185 may include a polyimide binder and a pigment mixed with red, green, and blue. The pixel defining layer 185 may include a cardo binder resin and a mixture of a lactam black pigment and a blue pigment. The pixel defining layer 185 may include carbon black. The pixel defining layer 185 including a black pigment may improve a contrast ratio, and may prevent reflection by a metal layer disposed therebelow.

An emission layer EL may be disposed on the pixel electrode PE and the pixel defining layer 185. The emission layer EL may contact the pixel electrode PE through the opening of the pixel defining layer 185. Unlike the drawings, the emission layer EL may be disposed in the opening of the pixel defining layer 185. The emission layer EL may include a light emitting material emitting blue light. The emission layer EL may include a light emitting material that emits red light or green light in addition to blue light. In addition to the emission layer EL, at least one of a hole injection layer, a hole transport layer, an electron transport layer, or an electron injection layer may be disposed on the pixel electrode PE.

A common electrode CE may be positioned on the emission layer EL. The common electrode CE may be positioned across the pixels PXa, PXb, and PXc. The common electrode CE may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrode CE may include a transparent conductive oxide such as an indium tin oxide (ITO) or an indium zinc oxide (IZO).

The pixel electrode PE, the emission layer EL, and the common electrode CE may constitute a light emitting diode LED, which may be an organic light emitting diode. The pixel electrode PE may be individually provided for each of the pixels PXa, PXb, and PXc to receive a driving current. The common electrode CE may be provided in common to the pixels PXa, PXb, and PXc to receive a common voltage $EL_{vss}$. The pixel electrode PE may be an anode that is a hole injection electrode, and the common electrode CE may be a cathode that is an electron injection electrode, and vice versa. The opening of the pixel defining layer 185 may correspond to an emission area of the light emitting diode LED.

A display unit encapsulation layer 190 (hereinafter, simply referred to as a first encapsulation layer) may be disposed on the common electrode CE. The first encapsulation layer 190 may encapsulate light emitting diodes LED, and may prevent penetration of moisture or oxygen from the outside. The first encapsulation layer 190 may cover the entire display area DA, and an edge of the first encapsulation layer 190 may be disposed in the non-display area NA. The first encapsulation layer 190 may be a thin film encapsulation layer including the first inorganic layer 191, the second inorganic layer 193, and the organic layer 192. The first inorganic layer 191 and the second inorganic layer 193 may mainly prevent penetration of moisture, etc., and the organic layer 192 may mainly planarize a surface of the first encapsulation layer 190, in particular, a surface of the second inorganic layer 193 in the display area DA. The first inorganic layer 191 and the second inorganic layer 193 may each include an inorganic insulating material such as a silicon oxide or a silicon nitride. The organic layer 192 may include an organic material such as an acryl-based resin, a methacrylic resin, polyisoprene, a vinyl-based resin, an epoxy-based resin, a urethane-based resin, a cellulose-based resin, a perylene-based resin, and the like.

The color conversion unit 200 may include a bank 210, a reflective layer 220, first and second color conversion layers 230a and 230b, a transmission layer 230c, a color conversion unit encapsulation layer 240, color filters 250a, 250b, and 250c, and an overcoat layer 260.

The bank 210 may be positioned on the first encapsulation layer 190 of the display unit 100. For example, a lower surface of the bank 210 may be in contact with an upper surface of the first encapsulation layer 190. The bank 210 may overlap the pixel defining layer 185. The bank 210 may not overlap or may hardly overlap the light emitting diodes LED. That is, the light emitting diodes LED is disposed between two banks 210 in a first direction x or a second direction y. The bank 210 may be positioned at a boundary of the pixels PXa, PXb, and PXc. The bank 210 may partition a pixel area.

The bank 210 may be liquid repellent. For example, surface energy of the bank 210 may be about 25 dyne/cm or less. In an inkjet process for forming the first and second color conversion layers 230a and 230b and the transmission layer 230c, spreadability of a droplet erroneously landing on the bank 210 or on the edge of the bank 210 may be controlled to prevent or reduce staying on the bank 210 or on an edge of the bank 210, and to reduce a size of the erroneously landed droplet. When there is a droplet erroneously landed on the bank 210, quality (e.g., adhesion, flatness, etc.) of a layer formed in a subsequent process may be deteriorated, and thus it may be necessary to remove it or reduce a size thereof.

A contact angle of droplets for forming the first and second color conversion layers 230a and 230b and the transmission layer 230c may be about 30° or more, about 40° or more, or about 50° or more by liquid repellency of the bank 210. The liquid repellency of the bank 210 may be formed by forming the bank 210 with a photosensitive resin composition including a liquid-repellent material, or may be provided by forming the bank 210 and then subjecting the surface of the bank 210 to a liquid-repellent treatment (e.g., plasma treatment). The bank 210 may include an organic material such as an acryl-based polymer, an epoxy-based polymer, an imide-based polymer, an olefin-based polymer, or an amide-based polymer.

The bank 210 may be transparent. Herein, the term "transparent" may mean that transmittance of visible light in the third direction z may be about 50% or more, about 60% or more, or about 70% or more. When the bank 210 is a black bank including a black pigment, it may be advantageous to prevent color mixing between the first and second color conversion layers 230a and 230b and the transmission layer 230c. However, since the black bank absorbs light emitted laterally from the first and second color conversion layers 230a and 230b and the transmission layer 230c, it may be difficult to recycle such side light. In addition, since the black bank absorbs light, it may be difficult to expose (irradiate ultraviolet rays) to a lower portion thereof during formation of the black bank, which may increase critical dimensions. Even when a white bank is formed, it may be difficult to form it finely due to diffuse reflection. Recycling of side light may be possible by forming the bank 210 with a transparent material, and it may be advantageous for realizing high resolution. In addition, a transparent bank may be more cost-effective than a black bank.

A plurality of openings 211a, 211b, and 211c overlapping the light emitting diodes LED is defined in the bank 210. The bank 210 may include wells 212a, 212b, and 212c overlapping the pixel defining layer 185. In other words, the openings 211a, 211b, and 211c and the wells 212a, 212b, and 212c may be defined by the bank 210.

The openings 211a, 211b, and 211c may extend through the bank 210 in the third direction z. The first opening 211a overlapping the light emitting diode LED corresponds to the first pixel PXa, the second opening 211b overlapping the light emitting diode LED corresponds to the second pixel PXb, and the third opening 211c overlapping the light emitting diode LED corresponds to the third pixel PXc.

The wells 212a, 212b, and 212c may extend through the bank 210 in the third direction z, but may not extend through it. As depicted in FIG. 3, the wells 212a, 212b, and 212c may include a first well 212a positioned between the first pixel PXa and the third pixel PXc in the first direction x, a second well 212b positioned between the second pixel PXb and the first and third pixels PXa and PXc in the second direction y, and a third well 212c positioned between adjacent second pixels PXb in the first direction x. The first well 212a may be formed to extend in the second direction y, and the second well 212b may be formed to extend in the first direction x. The third well 212c may have a larger area than that of each of the first well 212a and the second well 212b. The third well 212c may have a larger area than that of each of the first opening 211a, the second opening 211b, and the third opening 211c. The wells 212a, 212b, and 212c are isolated from one another, but may be connected. For example, the first well 212a and the second well 212b may be connected to form a T-shaped planar shape. A disposal, size, shape, etc. of the wells 212a, 212b, and 212c may be variously changed depending on a disposal, size, shape, etc. of the pixels PXa, PXb, and PXc.

A first color conversion layer 230a, a second color conversion layer 230b, and a transmission layer 230c may be positioned in the first opening 211a, the second opening 211b, and the third opening 211c, respectively. A reflective layer 220 may be positioned in the wells 212a, 212b, and 212c. Lower surfaces of the first color conversion layer 230a, the second color conversion layer 230b, and the transmission layer 230c may be in contact with an upper surface of the first encapsulation layer 190. A lower surface of the reflective layer 220 may be in contact with an upper surface of the first encapsulation layer 190. The first color conversion layer 230a, the second color conversion layer 230b, the transmission layer 230c, and the reflective layer 220 may be formed by an inkjet printing process. When the first and second color conversion layers 230a and 230b and the transmission layer 230c are formed, a height of the reflective layer 220 may be lower than that of the first and second color conversion layers 230a and 230b and the transmission layer 230c such that the wells 212a, 212b, and 212c may receive erroneously landed droplets.

The first color conversion layer 230a may overlap the light emitting diode LED corresponding to the first pixel PXa, and may convert light incident from the light emitting diode LED into light having a first wavelength. The light of the first wavelength may be red light having a maximum emission peak wavelength in the range of about 600 nm to about 650 nm, e.g., about 620 nm to about 650 nm.

The second color conversion layer 230b may overlap the light emitting diode LED corresponding to the second pixel PXb, and may convert light incident from the light emitting diode LED into light having a second wavelength. The light of the second wavelength may be green light having a maximum emission peak wavelength in the range of about 500 nm to about 550 nm, e.g., about 510 nm to about 550 nm.

The transmission layer 230c may overlap the light emitting diode LED corresponding to the third pixel PXc, and may transmit light incident from the light emitting diode LED. The light passing through the transmission layer 230c may be light of a third wavelength. The light of the third wavelength may be blue light having a maximum emission peak wavelength in the range of about 380 nm to about 480 nm, e.g., about 420 nm or more, about 430 nm or more, about 440 nm or more, or about 445 nm or more, and about 470 nm or less, about 460 nm or less, or about 455 nm or less.

The reflective layer 220 may overlap the pixel defining layer 185, and does not overlap the light emitting diode LED in the third direction z. When the bank 210 is transparent, some of the light emitted from the first color conversion layer 230a, the second color conversion layer 230b, and the transmission layer 230c may be laterally emitted to pass through the bank 210. The reflective layer 220 may reflect the light emitted laterally from the first color conversion layer 230a, the second color conversion layer 230b, and the transmission layer 230c back to the first color conversion layer 230a, the second color conversion layer 230b, and the transmission layer 230c. Since the light emitted laterally from the first color conversion layer 230a, the second color conversion layer 230b, and the transmission layer 230c may be reused, light efficiency may be improved. In addition, it is possible to prevent color mixing and luminance influence between the adjacent pixels PXa, PXb, and PXc, by preventing the light emitted from the first and second color conversion layers 230a and 230b and the transmission layer 230c corresponding to different pixels PXa, PXb, and PXc from entering the color conversion layers 230a and 230b and the transmission layer 230c adjacent thereto. The reflective layer 220 may be formed by curing white ink, and may be white.

The first color conversion layer 230a and the second color conversion layer 230b may include first quantum dots 231a and second quantum dots 231b, respectively. For example, light incident to the first color conversion layer 230a may be converted into light of a first wavelength by the first quantum dots 231a to be emitted. Light incident to the second color conversion layer 230b may be converted into light of a second wavelength by the second quantum dots 231b to be emitted. The first color conversion layer 230a, the second color conversion layer 230b, and the transmission layer 230c may each include scatterers 232. The scatterers 232 may scatter light incident to the first color conversion layer 230a, the second color conversion layer 230b, and the transmission layer 230c to improve light efficiency. The reflective layer 220 may include the scatterers 232. The reflective layer 220 may include the scatterers 232 at a higher density than that of the first and second color conversion layers 230a and 230b and the transmission layer 230c to increase reflectivity of the reflective layer 220.

The scatterers 232 may be metal oxide particles and/or organic particles. As such a metal oxide, $TiO_2$, $ZrO_2$, $Al_2O_3$, $In_2O_3$, $ZnO$, $SnO_2$, etc. may be exemplified. As a material of the organic particles, an acrylic resin, a urethane resin, or the like may be exemplified. The scatterer 232 may scatter light in a random direction regardless of an incident direction of the incident light.

Each of the first quantum dots 231a and the second quantum dots 231b (hereinafter, also referred to as semiconductor nanocrystals) may independently include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal (e.g., CuInS).

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof; and a four-element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a group II metal (e.g., InZnP).

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof.

The Group IV element or compound may be selected from a one-element material selected from Si and Ge, and a combination thereof; and a two-element compound selected from SiC, SiGe, and a combination thereof.

The Group I-III-VI compound may be selected from AgInS, $CuInSe_2$, $CuInS_2$, CuInGaSe, and CuInGaS.

The Group II-III-VI compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof.

The group I-II-IV-VI compound may be selected from CuZnSnSe and CuZnSnS.

The quantum dots may not contain cadmium. The quantum dots may include semiconductor nanocrystals based on Group III-V compounds including indium and phosphorus. The Group III-V compounds may further contain zinc. The quantum dots may include semiconductor nanocrystals based on a Group II-VI compound including a chalcogen element (e.g., sulfur, selenium, tellurium, or a combination thereof) and zinc.

In the quantum dots, the two-element compound, the three-element compound, and/or the four-element compound described above may be present in particles at uniform concentrations, or they may be present in the same particle in a state of being divided into plurality of portions having different concentrations, respectively. In addition, a core-shell structure in which some quantum dots surround some other quantum dots may be possible. An interface between the core and the shell may have a concentration gradient in which a concentration of elements of the shell decreases closer to a center thereof.

In some embodiments, the quantum dot may have a core-shell structure that includes a core including the semiconductor nanocrystal described above and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or a multilayer. An example of the shell of the quantum dot includes a metal or nonmetal oxide, a semiconductor compound, or a combination thereof.

Examples of an oxide of the metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO and a three-element compound such as $MgAl_2O_4$, $CoFe_2O_4$, $NiFe_2O_4$, or $CoMn_2O_4$.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like.

The quantum dot may have a full width at half maximum) of the light-emitting wavelength spectrum that is equal to or less than about 45 nm, equal to or less than about 40 nm, or equal to or less than about 30 nm, and in this range, color purity or color reproducibility may be improved. In addition, since light emitted through the quantum dot is emitted in all directions, a viewing angle of light may be improved.

In the quantum dot, a shell material and a core material may have different energy band gaps. For example, the energy band gap of the shell material may be larger or smaller than that of the core material. The quantum dot may have a multi-layered shell. In the multilayered shell, the energy band gap of an outer layer may be larger than that of an inner layer (i.e., a layer closer to the core). In the multilayered shell, the energy band gap of the outer layer may be smaller than the energy band gap of the inner layer.

A shape of the quantum dot is not particularly limited. For example, the shape of the quantum dot may include a sphere, a polyhedron, a pyramid, a multipod, a square, a cuboid, a nanotube, a nanorod, a nanowire, a nanosheet, or a combination thereof.

The quantum dot may include an organic ligand (e.g., having a hydrophobic moiety and/or a hydrophilic moiety). The organic ligand moiety may be bonded to a surface of the quantum dot. The organic ligand may include RCOOH, $RNH_2$, $R_2NH$, $R_3N$, RSH, $R_3PO$, $R_3P$, ROH, RCOOR, $RPO(OH)_2$, $RHPOOH$, $R_2POOH$, or a combination thereof. Herein, each R may independently indicate a substituted or unsubstituted C3 to C40 (e.g., C5 or more and C24 or less) alkyl, a substituted or unsubstituted C3 to C40 aliphatic hydrocarbon group such as a substituted or unsubstituted alkenyl, a substituted or unsubstituted C6 to C40 (e.g., C6 or more and C20 or less) aromatic hydrocarbon group such as a substituted or unsubstituted C6 to C40 aryl group, or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributylamine, and trioctylamine; a carboxylic acid compound such as methanic acid, ethanic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide, diphenyl phosphine, a triphenyl phosphine compound or an oxide compound thereof; or a C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid. The quantum dot may contain a hydrophobic organic ligand alone or as a mixture of one or more. The hydrophobic organic ligand (e.g., an acrylate group, a methacrylate group, etc.) may not contain a photopolymerizable moiety.

A color conversion unit encapsulation layer 240 (hereinafter, simply referred to as a second encapsulation layer) may be positioned on the bank 210, the reflective layer 220, the first and second color conversion layers 230a and 230b, and the transmission layer 230c. The second encapsulation layer 240 may encapsulate the reflective layer 220, the first and second color conversion layers 230a and 230b, and the transmission layer 230c. The second encapsulation layer 240 may be a thin film encapsulation layer including a first inorganic layer 241, an organic layer 242, and a second inorganic layer 243. The first inorganic layer 241 and the second inorganic layer 243 may mainly prevent penetration of moisture, etc., and the organic layer 242 may mainly planarize the surface of the second encapsulation layer 240, particularly the surface of the second inorganic layer 243. The first inorganic layer 241 and the second inorganic layer 243 may each include an inorganic insulating material such as a silicon oxide or a silicon nitride. The organic layer 242 may include an organic material such as an acryl-based resin, a methacrylic resin, polyisoprene, a vinyl-based resin, an epoxy-based resin, a urethane-based resin, a cellulose-based resin, a perylene-based resin, and the like.

At least one of the first inorganic layer 241, the organic layer 242, or the second inorganic layer 243 may be a low refractive index layer. For example, the organic layer 242 may be a low refractive index layer, and the organic layer 242 may include an organic material having a low refractive index. A refractive index of the low refractive index layer may be in a range of about 1.1 to about 1.3.

Color filters 250a, 250b, and 250c may be positioned on the second encapsulation layer 240. The color filters 250a, 250b, and 250c may overlap openings of the pixel defining layer 185. The color filters 250a, 250b, and 250c may include a first color filter 250a that transmits light of a first wavelength and absorbs light of a remaining wavelength, a second color filter 250b that transmits light of a second wavelength and absorbs light of a remaining wavelength, and a third color filter 250c that transmits light of a third wavelength and absorbs light of a remaining wavelength.

The first color filter 250a, the second color filter 250b, and the third color filter 250c may overlap the first color conversion layer 230a, the second color conversion layer 230b, and the transmission layer 230c, respectively. The first color filter 250a, the second color filter 250b, and the third color filter 250c may correspond to the first pixel PXa, the second pixel PXb, and the third pixel PXc, respectively. Accordingly, purity of light of a first wavelength (corresponding to the first pixel PXa), light of a second wavelength (corresponding to the second pixel PXb), and light of a third wavelength (corresponding to the second pixel PXb) emitted to the outside of the display panel 10 may be increased. The light of the first wavelength, the light of the second wavelength, and the light of the third wavelength may be red light, green light, and blue light, respectively.

At a boundary between the pixels PXa, PXb, and PXc, the first color filter 250a, the second color filter 250b, and the third color filter 250c may overlap each other to form a light blocking region. As illustrated, the first color filter 250a, the second color filter 250b, and the third color filter 250c may all overlap to form a light blocking region, but two color filters may overlap to form a light blocking region. For example, the first color filter 250a and the second color filter 250b may overlap at a boundary between the first pixel PXa and the second pixel PXb, the second color filter 250b and the third color filter 250c may overlap at a boundary between the second pixel PXb and the third pixel PXc, and the third color filter 250c and the first color filter 250a may overlap at a boundary between the third pixel PXc and the first pixel PXa. Since the reflective layer 220 is positioned at the boundary between the pixels PXa, PXb, and PXc, the first color filter 250a, the second color filter 250b, and the third color filter 250c may overlap each other on the reflective layer 220 to form a light blocking region. The first color filter 250a, the second color filter 250b, and the third color filter 250c are stacked in this order on the second encapsulation layer 240, but they may be stacked in another order. A light blocking region may be provided by forming a light blocking member including a black pigment or dye instead of overlapping the color filters 250a, 250b, and 250c.

An overcoat layer 260 may be disposed on the color filters 250a, 250b, and 250c. The overcoat layer 260 may include an inorganic insulating material and/or an organic insulating material, and may be a single layer or multiple layers. An anti-reflection layer (not illustrated) for reducing external light reflection may be disposed on the overcoat layer 260.

As for the display panel 10 having the structure as described above, the color conversion unit 200 may not be formed on a separate substrate and may not be bonded to the display unit 100, but may be formed on the display unit 100, thereby reducing a thickness and a weight of the display panel 10 and a manufacturing cost thereof. In addition, a distance between the light emitting diode LED as a light source and the color conversion layers 230a and 230b and the transmission layer 230c may be close to a thickness of the first encapsulation layer 190, thereby reducing light loss and increasing light efficiency.

Figure 6:
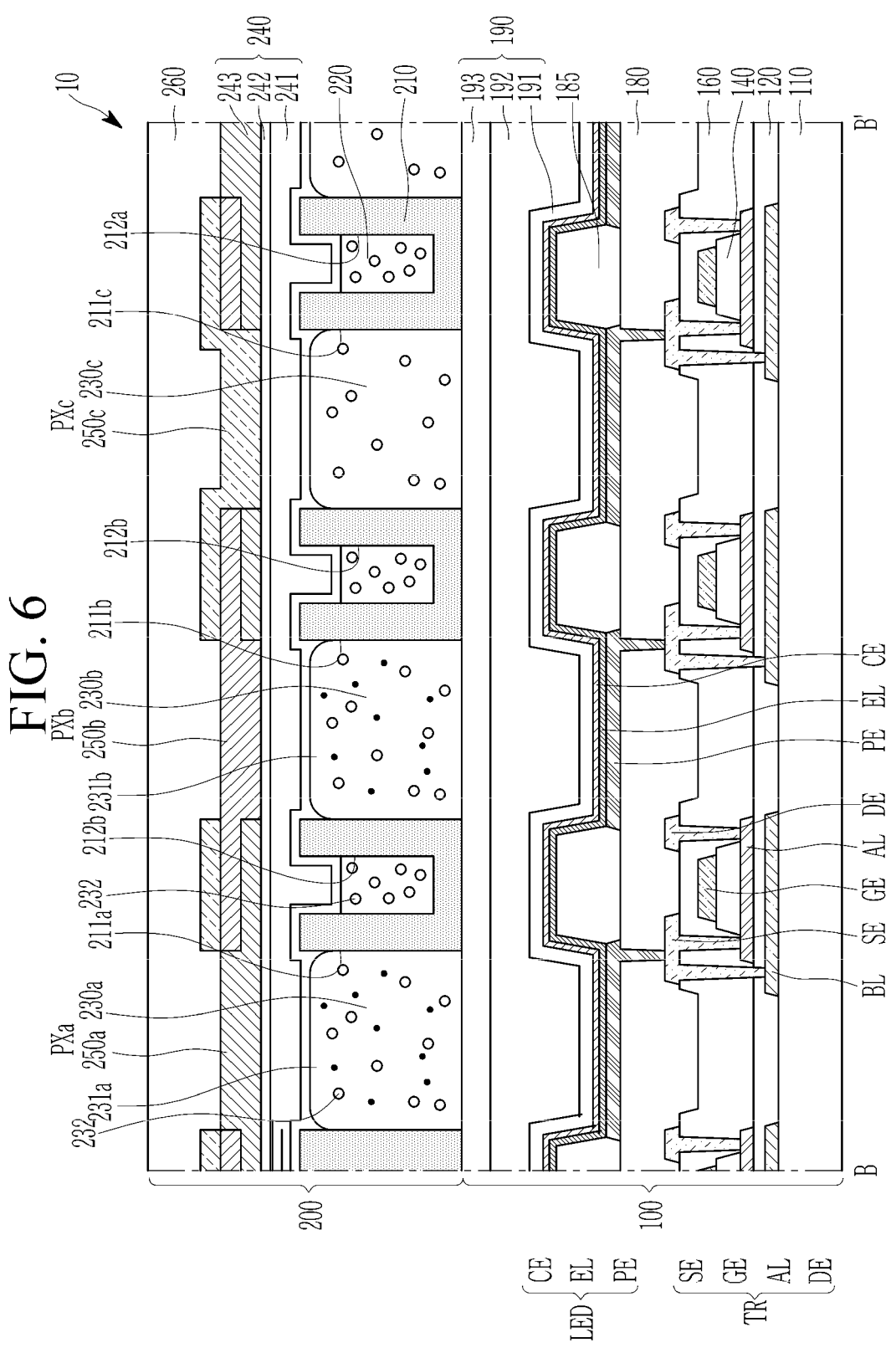
FIG. 6 illustrates a cross-sectional view taken along a line A-A' of FIG. 3 according to an embodiment.

FIG. 6 illustrates a cross-sectional view taken along a line A-A' of FIG. 3 according to an embodiment.

Referring to FIG. 6, a structure of the first and second wells 212a and 212b is different from that of the above-described embodiment. The first and second wells 212a and 212b may be formed in the form of grooves in the bank 210. In other words, the first and second wells 212a and 212b may be formed to a predetermined depth without extending through the bank 210. Depths of the first and second wells 212a and 212b may be about ½ or more, about ⅔ or more, or about ¾ or more of the thickness of the bank 210. As such, when the first and second wells 212*a* and 212*b* are formed in the form of grooves, thin portions of the bank 210 may be connected to form a strong structure, and possibility of damage to the bank 210 may be reduced. Meanwhile, the third well 212*c* may be formed in the form of an opening extending through the bank 210. The first and second wells 212*a* and 212*b* and the third well 212*c* may be formed together in a same process, e.g., by applying an organic material and patterning using a halftone mask.

When the wells 212*a* and 212*b* are formed to have a groove shape, the reflective layer 220 will be formed to a depth where the wells 212*a* and 212*b* are formed, and thus color mixing may occur between the color conversion layers 230*a* and 230*b* and the transmission layer 230*c* that are adjacent through lower portions of the wells 212*a* and 212*b*. To prevent this problem, the bank 210 may be a white bank capable of reflecting side light emitted from the color conversion layers 230*a* and 230*b* and the transmission layer 230*c*, or a black bank absorbing side light.

Figure 7:
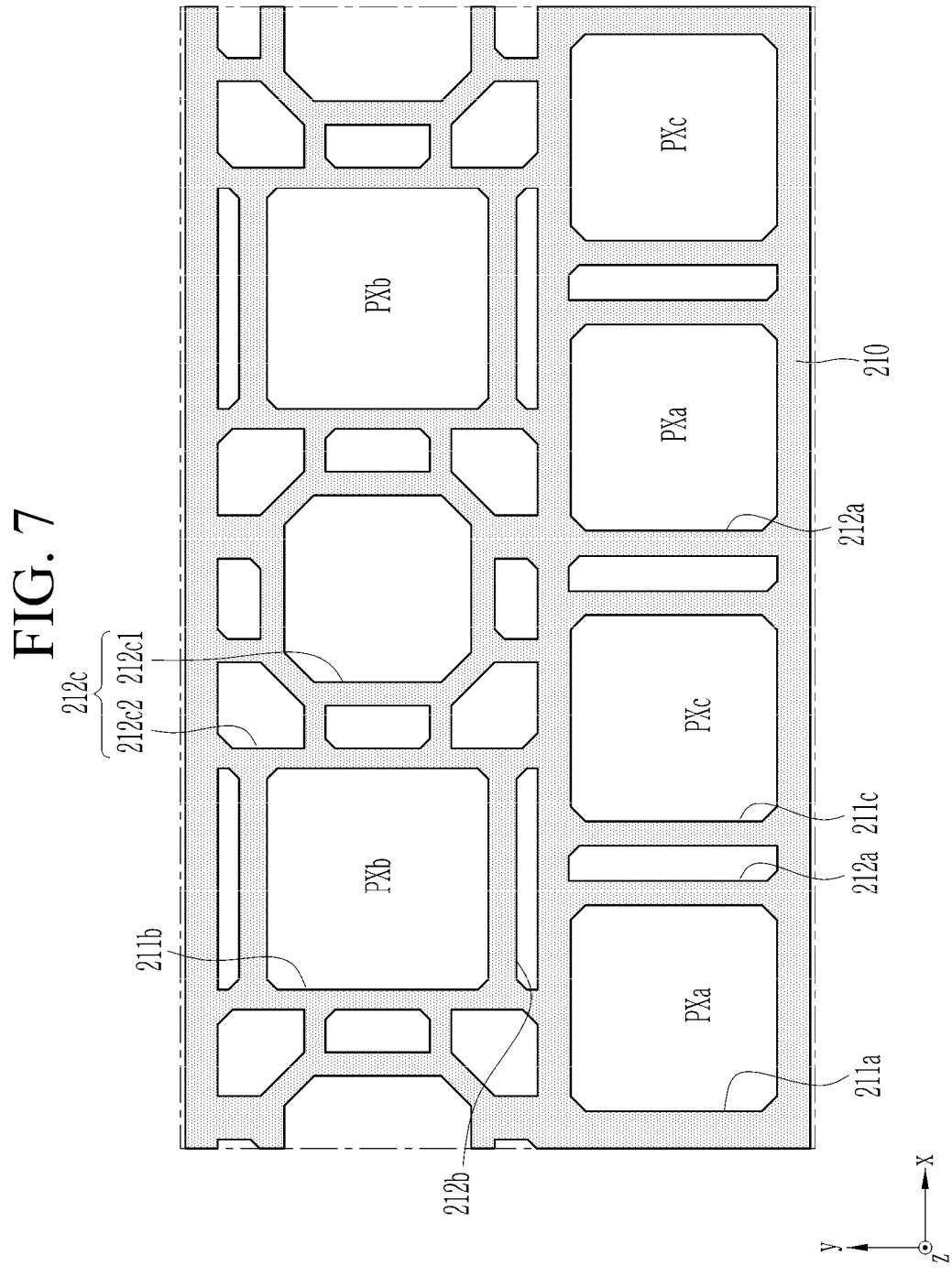
FIG. 7 illustrates a top plan view of a display area in a display panel according to an embodiment.

FIG. 7 illustrates a top plan view of a display area in a display panel according to an embodiment.

Referring to FIG. 7, an example in which the third well 212*c* formed in the bank 210 positioned between the neighboring second pixels PXb is divided into a plurality of portions is illustrated. The third well 212*c* may include a first portion 212*c*1 having a relatively large area positioned at a center thereof and at least four second portions 212*c*2 surrounding the first portion 212*c*1 at each vertex. The first and second portions 212*c*1 and 212*c*2 may be partitioned by the bank 210. When the third well 212*c* is divided in this way, portions of the bank 210 defining the third well 212*c* are connected to each other, to firmly form the bank 210. Each of the third wells 212*c* may be formed in the form of an opening extending through the bank 210 or may be formed in the form of a groove in the bank 210. For example, in the illustrated embodiment, all portions 212*c*1 and 212*c*2 of the third well 212*c* may be formed in an opening shape. As another example, the relatively wide first portion 212*c*1 positioned at a center thereof may be formed in the form of an opening, and the eight second portions 212*c*2 surrounding the first portion 212*c*1 may be formed in the form of a groove.

FIG. 8, FIG. 9, FIG. 10, and FIG. 11 illustrate manufacturing processes of a display panel according to an embodiment.

FIGS. 8, 9, 10, and 11 may illustrate manufacturing processes of the display panel 10 illustrated in FIGS. 3, 4, and 5. This will be described with cross-reference to FIGS. 3, 4, and 5.

Figure 8:
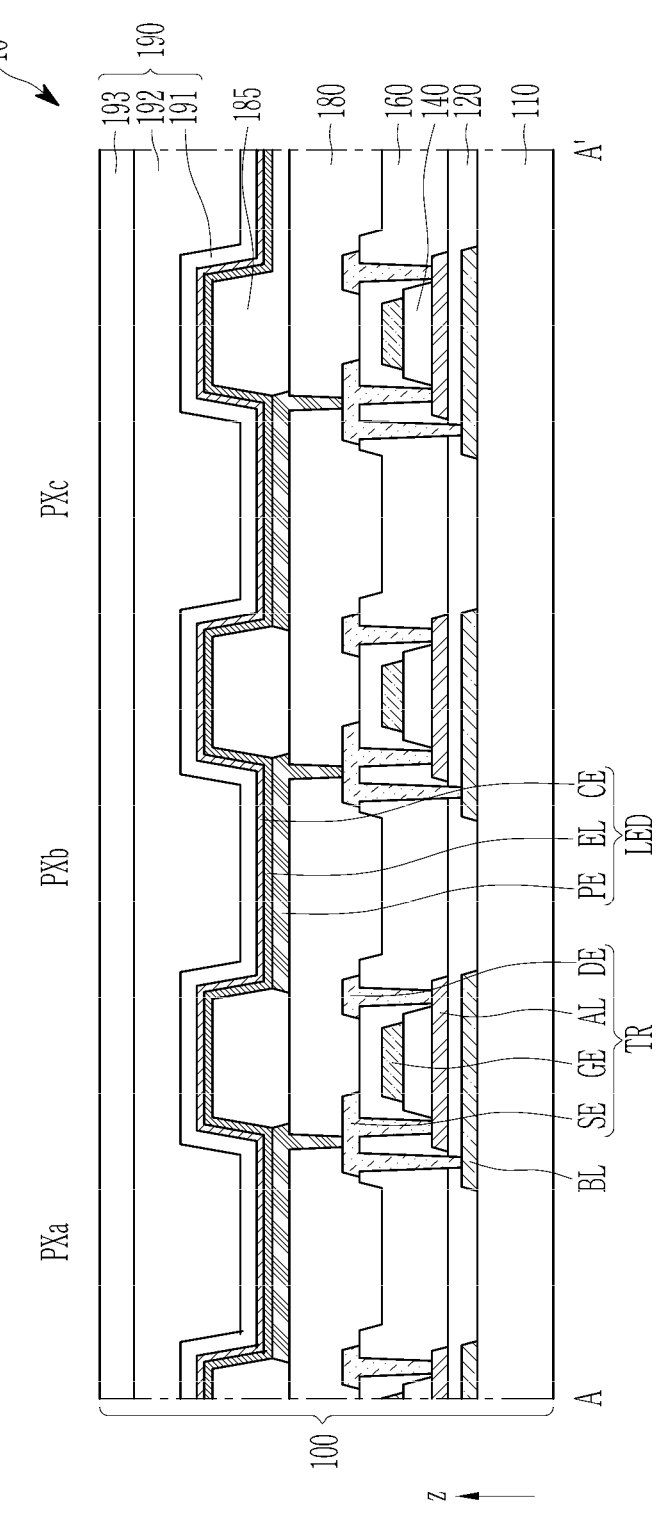
FIG. 8, FIG. 9, FIG. 10, and FIG. 11 illustrate manufacturing processes of a display panel according to an embodiment.

Referring to FIG. 8, a process of forming the display unit 100 may be performed first. A light blocking layer BL may be formed by forming a conductive layer on the substrate 110 and then patterning it. The buffer layer 120 may be formed on the light blocking layer BL, and a semiconductor material layer may be formed on the buffer layer 120 and patterned to form the semiconductor layer AL. Next, the gate insulating material layer covering the semiconductor layer AL may be formed. Next, a conductive layer is formed on the gate insulating material layer and then patterned to form the gate electrode GE. After the gate electrode GE is formed, the gate insulating material layer may be etched to form the gate insulating layer 140 such that a portion thereof overlapping the gate electrode GE and the like remains. Next, the interlayer insulating layer 160 may be formed on the gate electrode GE. Next, contact holes extending through the interlayer insulating layer 160 and overlapping a first region and a second region of the semiconductor layer AL and a contact hole extending through the interlayer insulating layer 160 and the buffer layer 120 and overlapping the light blocking layer BL may be formed. The first electrode SE and the second electrode DE may be formed by forming a conductive layer on the interlayer insulating layer 160 and then patterning it. The first electrode SE may be connected to the first region of the semiconductor layer AL and the light blocking layer BL through contact holes. The second electrode DE may be connected to the second region of the semiconductor layer AL through a contact hole. Next, the planarization layer 180 may be formed, and a contact hole extending through the planarization layer 180 and overlapping the first electrode SE may be formed. Next, the pixel electrode PE may be formed by forming a conductive layer and then patterning it. Next, the pixel defining layer 185 including an opening exposing a portion of the pixel electrode PE may be formed on the planarization layer 180. Next, the emission layer EL may be formed on the pixel electrode PE, and the common electrode CE may be formed on the emission layer EL. Next, the first inorganic layer 191, the organic layer 192, and the second inorganic layer 193 may be formed on the common electrode CE to form the first encapsulation layer 190. Although not illustrated, a capping layer and/or a functional layer may be further formed between the common electrode CE and the first encapsulation layer 190.

Figure 9:
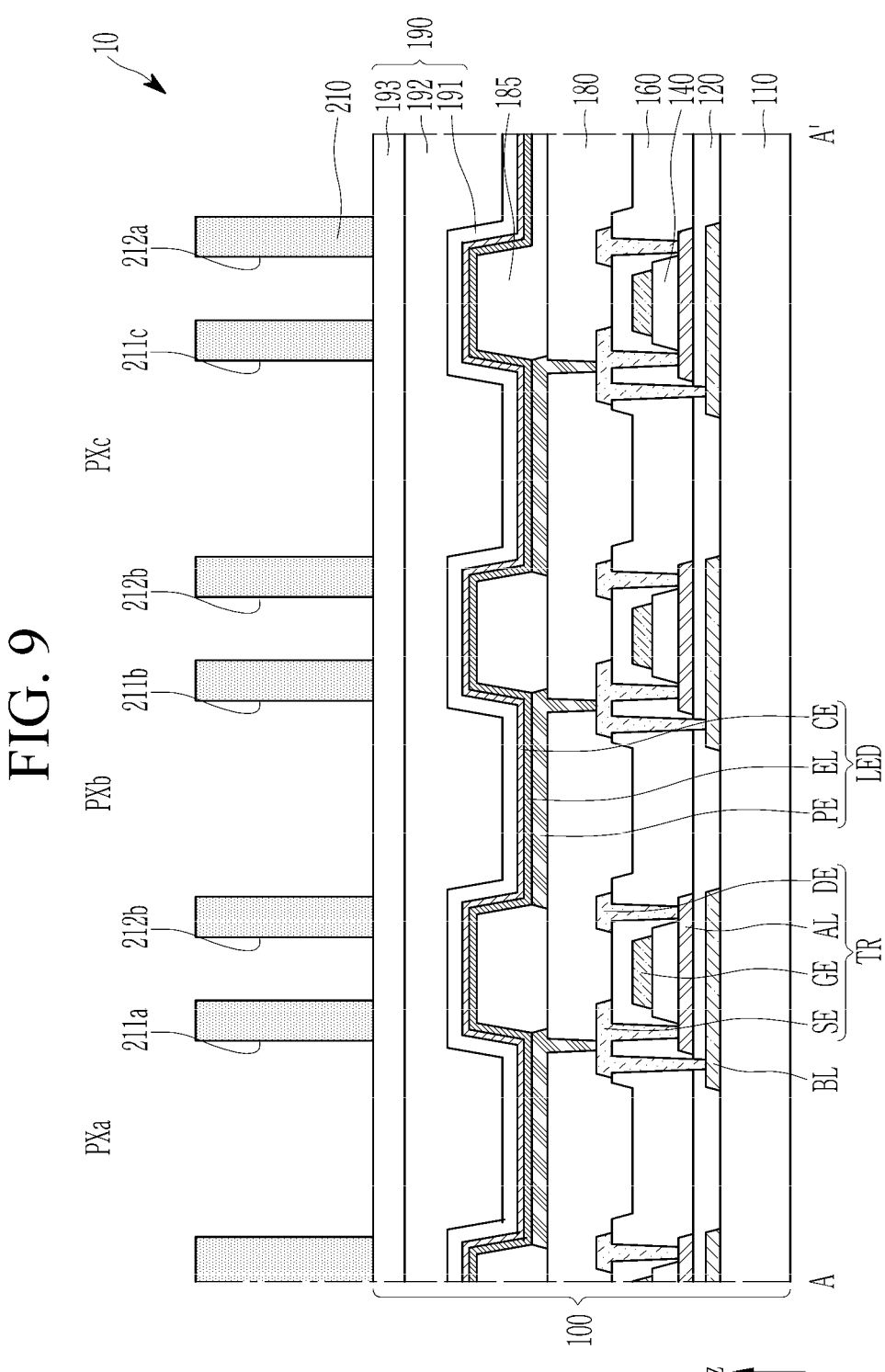

Referring to FIG. 9, the bank 210 may be formed on the first encapsulation layer 190 of the display unit 100. The bank 210 may define the openings 211*a*, 211*b*, and 211*c* and the wells 212*a*, 212*b*, and 212*c*. The bank 210, the openings 211*a*, 211*b*, and 211*c*, and the wells 212*a*, 212*b*, and 212*c* may be formed by applying a photosensitive organic material and then patterning it. The bank 210 may be liquid-repellent, and the liquid repellency of the bank 210 may be imparted by forming the bank 210 using a photosensitive organic material including a liquid-repellent material, or by forming the bank 210 and then treating a surface thereof to be lyophobic. The bank 210 and the wells 212*a*, 212*b*, and 212*c* may be positioned at a boundary between the pixels PXa, PXb, and PXc, and may overlap the pixel defining layer 185.

Figure 10:
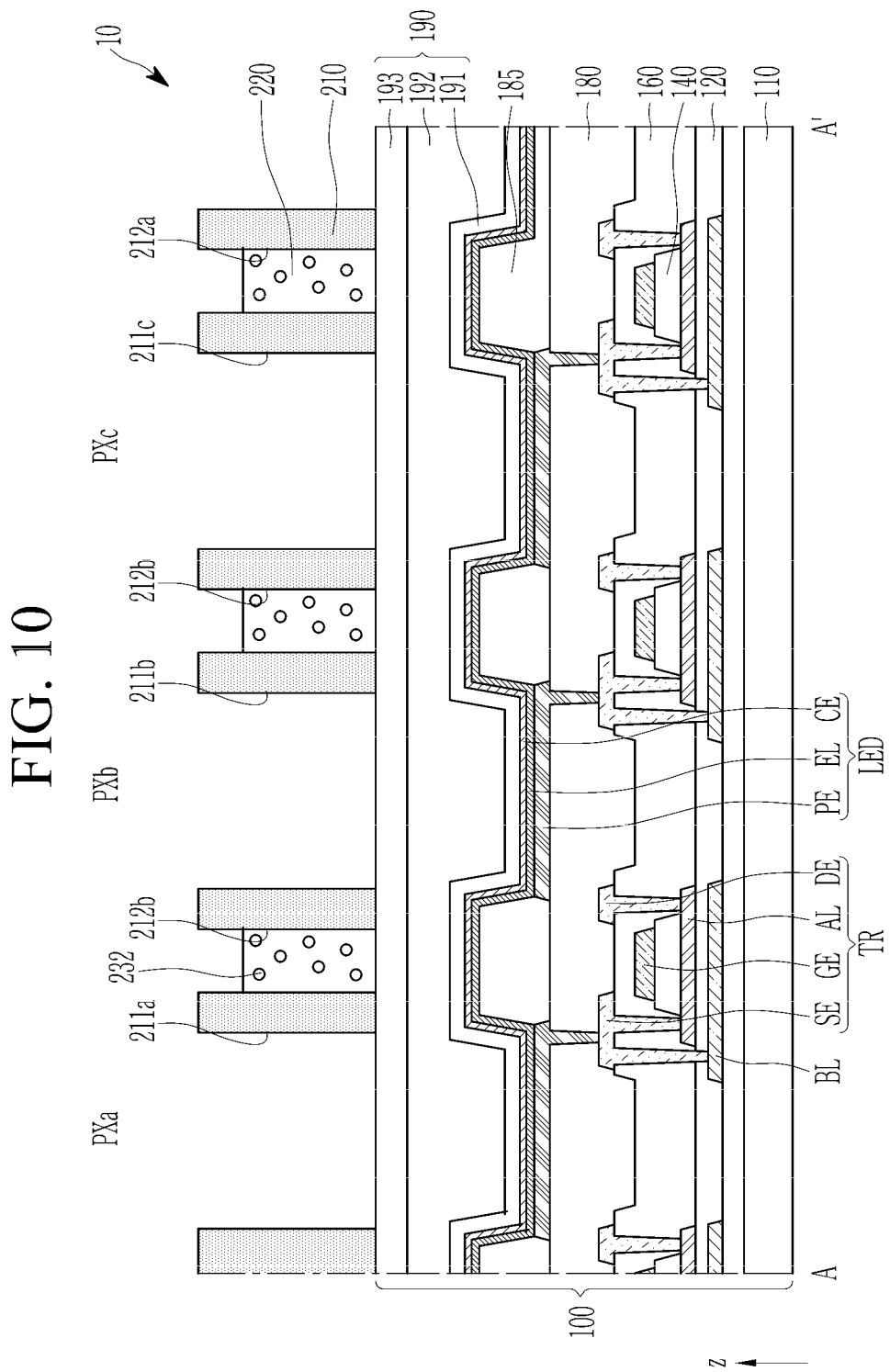

Referring to FIG. 10, the reflective layer 220 may be formed in the wells 212*a*, 212*b*, and 212*c*. The reflective layer 220 may be formed by an inkjet printing process for discharging white ink into the wells 212*a*, 212*b*, and 212*c*. The white ink may be, e.g., in a form in which the scatters 232 is mixed with a liquid base resin, and may be hardened by irradiating ultraviolet rays to it after being deposited in the wells 212*a*, 212*b*, and 212*c*. As the bank 210 is liquid-repellent, a droplet that mistakenly lands on the bank 210 may enter the wells 212*a*, 212*b*, and 212*c* or may be small in size. The reflective layer 220 may not completely fill the wells 212*a*, 212*b*, and 212*c*, but may be formed lower than upper surfaces of the wells 212*a*, 212*b*, and 212*c*, i.e., lower than an upper end of the bank 210.

Figure 11:
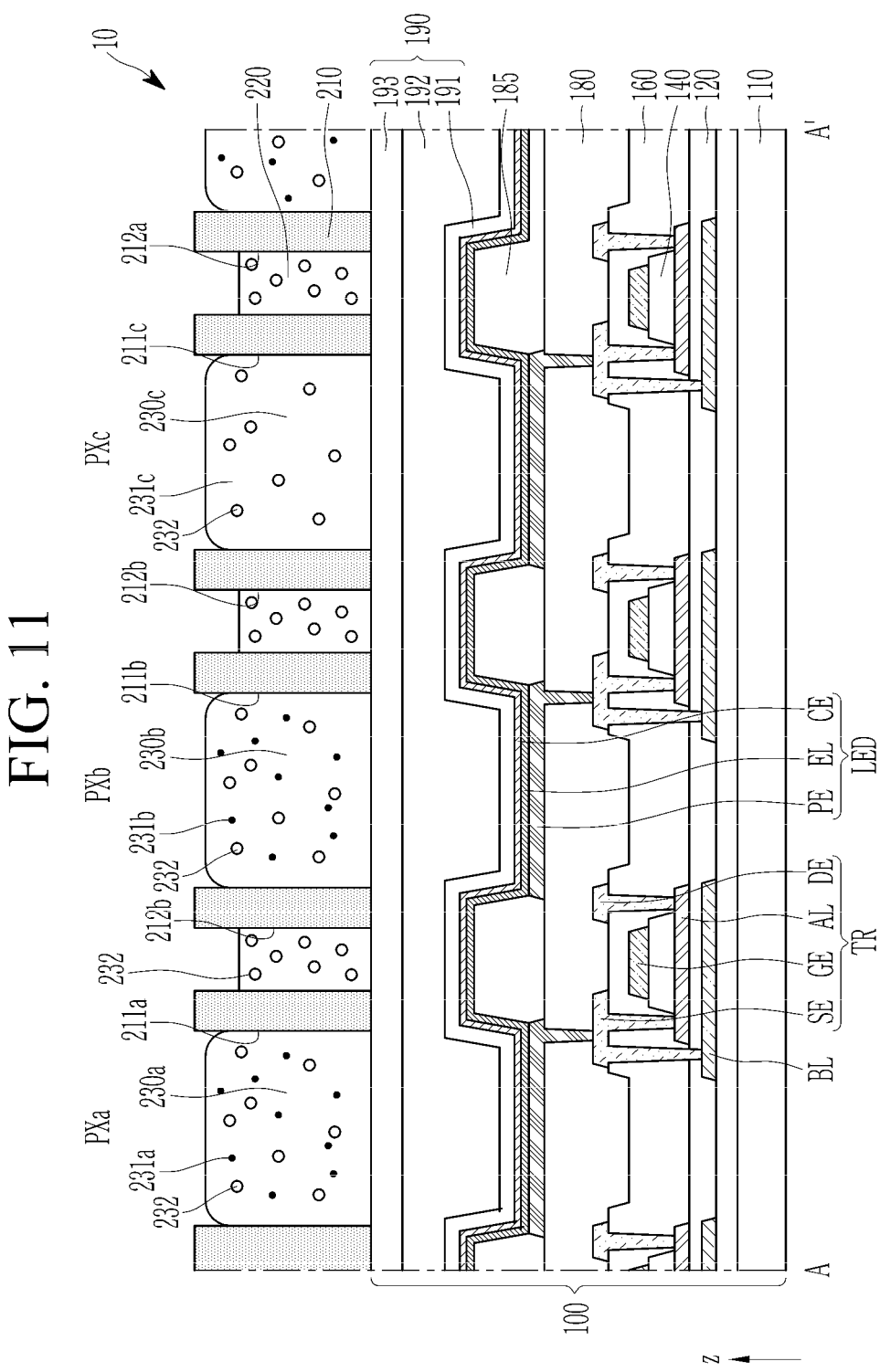

Referring to FIG. 11, the first color conversion layer 230*a* may be formed in the first opening 211*a*, the second color conversion layer 230*b* may be formed in the second opening 211*b*, and the transmission layer 230*c* may be formed in the third opening 211*c*. A material of the first and second color conversion layers 230*a* and 230*b* and the transmission layer 230*c* may be provided as ink mixed or dispersed in a solvent, and the first and second color conversion layers 230*a* and 230*b* and the transmission layer 230*c* may be formed by an inkjet printing process. When the first and second color conversion layers 230*a* and 230*b* and the transmission layer

230c are formed, the droplet that erroneously lands on the bank 210 may either enter the corresponding openings 211a, 211b, and 211c, or the wells 212a, 212b, and 212c that are not completely filled by the reflective layer 220, or may be small in size since the bank 210 is liquid-repellent. Since the inkjet printing process forms a pattern by printing, a material for pattern formation may be reduced, unlike a photolithography process in which a layer is formed to cover the entire substrate 110 and then partially removed to form a pattern. In addition, since the inkjet printing process does not require use of a mask, the process and a cost may be reduced.

Thereafter, referring to FIG. 4 and FIG. 5, the second encapsulation layer 240 covering the reflective layer 220, the first and second color conversion layers 230a and 230b, and the transmission layer 230c may be formed, and the color filters 250a, 250b, and 250c may be formed on the second encapsulation layer 240.

While this disclosure has been described in connection with what is presently considered to be practical embodiments, it is to be understood that the present disclosure is not limited to the disclosed embodiments, but, on the contrary, is intended to cover various modifications and equivalent arrangements included within the spirit and scope of the appended claims.

What is claimed is:

1. A display device comprising:
a substrate;
a plurality of light emitting diodes disposed on the substrate;
a first encapsulation layer disposed on the light emitting diodes;
a bank disposed on the first encapsulation layer configured to define openings and a well;
a color conversion layer or a transmission layer disposed in each of the openings; and
a reflective layer disposed within the well and disposed between the color conversion layer and the transmission layer.

2. The display device of claim 1, wherein each of the color conversion layer and the transmission layer overlaps one of the light emitting diodes, and the reflective layer does not overlap any of the light emitting diodes.

3. The display device of claim 1, wherein a height of the reflective layer is lower than a height of the color conversion layer or the transmission layer in a thickness direction.

4. The display device of claim 1, further comprising a second encapsulation layer disposed on the bank, the color conversion layer, the transmission layer, and the reflective layer,
wherein the second encapsulation layer includes a low refractive index layer.

5. The display device of claim 4, further comprising:
a first color filter disposed on the second encapsulation layer to overlap the color conversion layer and the reflective layer; and
a second color filter disposed on the second encapsulation layer to overlap the transmission layer and the reflective layer.

6. The display device of claim 1, wherein a lower surface of the bank is in contact with an upper surface of the first encapsulation layer.

7. The display device of claim 1, wherein a lower surface of the color conversion layer and a lower surface of the transmission layer are in contact with an upper surface of the first encapsulation layer.

8. The display device of claim 1, wherein a lower surface of the reflective layer is in contact with an upper surface of the first encapsulation layer.

9. The display device of claim 1, wherein the well is formed in a form of a groove in the bank.

10. The display device of claim 1, wherein an area of the well is smaller than an area of each of the openings.

11. The display device of claim 1, wherein the well is partitioned into a plurality of portions by the bank, and the plurality of portions include a first portion disposed at a central portion and at least four second portions surrounding the first portion at each vertex.

12. The display device of claim 1, wherein the bank has surface energy of 25 dyne/cm or less.

13. The display device of claim 1, wherein the bank is transparent.

14. The display device of claim 1, wherein the reflective layer is formed by curing white ink.

15. The display device of claim 1, wherein the color conversion layer includes quantum dots and scatterers, and the transmission layer and the reflective layer include scatterers.

16. A display device comprising
a substrate;
first, second, and third transistors disposed on the substrate;
an insulating layer disposed on the first, second, and third transistors;
first, second, and third light emitting diodes disposed on the insulating layer and electrically connected to the first, second, and third transistors, respectively;
an encapsulation layer disposed on the first, second, and third light emitting diodes to include an inorganic layer and an organic layer;
a bank disposed on the encapsulation layer to define first, second, and third openings and a well;
a first color conversion layer, a second color conversion layer, and a transmission layer disposed in first, second, and third openings to overlap the first, second, and third light emitting diodes, respectively; and
a reflective layer disposed within the well and disposed between the first color conversion layer or the second color conversion layer and the transmission layer.

17. The display device of claim 16, wherein a height of the reflective layer is lower than a height of the first color conversion layer, the second color conversion layer, or the transmission layer.

18. The display device of claim 16, wherein the bank has surface energy of 25 dyne/cm or less.

19. The display device of claim 16, wherein the first and second color conversion layers include quantum dots and scatterers, and the transmission layer and the reflective layer include scatterers.

20. The display device of claim 16, wherein each of the bank, the first color conversion layer, the second color conversion layer, and the transmission layer is in contact with the encapsulation layer.

* * * * *